United States Patent
Koehler et al.

(10) Patent No.: US 7,330,807 B2
(45) Date of Patent: Feb. 12, 2008

(54) METHOD, COMPUTER PROGRAM PRODUCT AND COMPUTER SYSTEM FOR THE AUTOMATIC PRODUCTION OF A FILTER UNIT

(75) Inventors: Ulrich Koehler, Adelebsen (DE); Ulrich Quaschning, Goettingen (DE); Jochen Von Der Hardt, Goettingen (DE)

(73) Assignee: Sartorius Stedim Biotech GmbH, Goettingen (DE)

( * ) Notice: Subject to any disclaimer, the term of this patent is extended or adjusted under 35 U.S.C. 154(b) by 646 days.

(21) Appl. No.: 10/204,551

(22) PCT Filed: Feb. 8, 2001

(86) PCT No.: PCT/EP01/01361

§ 371 (c)(1),
(2), (4) Date: Jan. 3, 2003

(87) PCT Pub. No.: WO01/63468

PCT Pub. Date: Aug. 30, 2001

(65) Prior Publication Data

US 2003/0144756 A1    Jul. 31, 2003

(30) Foreign Application Priority Data

Feb. 22, 2000   (DE) ............... 100 08 017

(51) Int. Cl.
G06G 7/48      (2006.01)
G06F 7/00      (2006.01)
G06F 15/00     (2006.01)

(52) U.S. Cl. ............... 703/7; 707/1; 707/100; 707/101; 707/102; 703/6; 715/502

(58) Field of Classification Search ............ 703/6, 703/7; 707/1; 715/502
See application file for complete search history.

(56) References Cited

U.S. PATENT DOCUMENTS 5,386,506 A    1/1995   Satoh et al.

(Continued)

FOREIGN PATENT DOCUMENTS

DE    4218504 A1    1/1993

(Continued)

OTHER PUBLICATIONS

The MathWorks, Inc., DSP Blockset User's Guide Version 2. ©1995-1998. Table of Contents and Chapters 1 & 2, and pp. 1-10 of Chapter 3.*

(Continued)

*Primary Examiner*—Paul Rodriguez
*Assistant Examiner*—Ayal Sharon
(74) *Attorney, Agent, or Firm*—Crowell & Moring LLP

(57) ABSTRACT

The invention relates to a method for the automatic production of a filter installation that consists of a plurality of structural parts or elements. The inventive method comprises the following steps: choosing a field of application of the filter installation to be produced among a plurality of predetermined or predeterminable fields of application and/or choosing a design of the filter installation to be produced among a plurality of predetermined or predeterminable designs; producing an input field depending on the choice made, only those inputs being enabled in said input field that correspond to the choice made. The invention further relates to a computer program product and to a computer system for the automatic production of a filter installation that consists of a plurality of structural parts or elements.

13 Claims, 13 Drawing Sheets

U.S. PATENT DOCUMENTS

Figure 1:
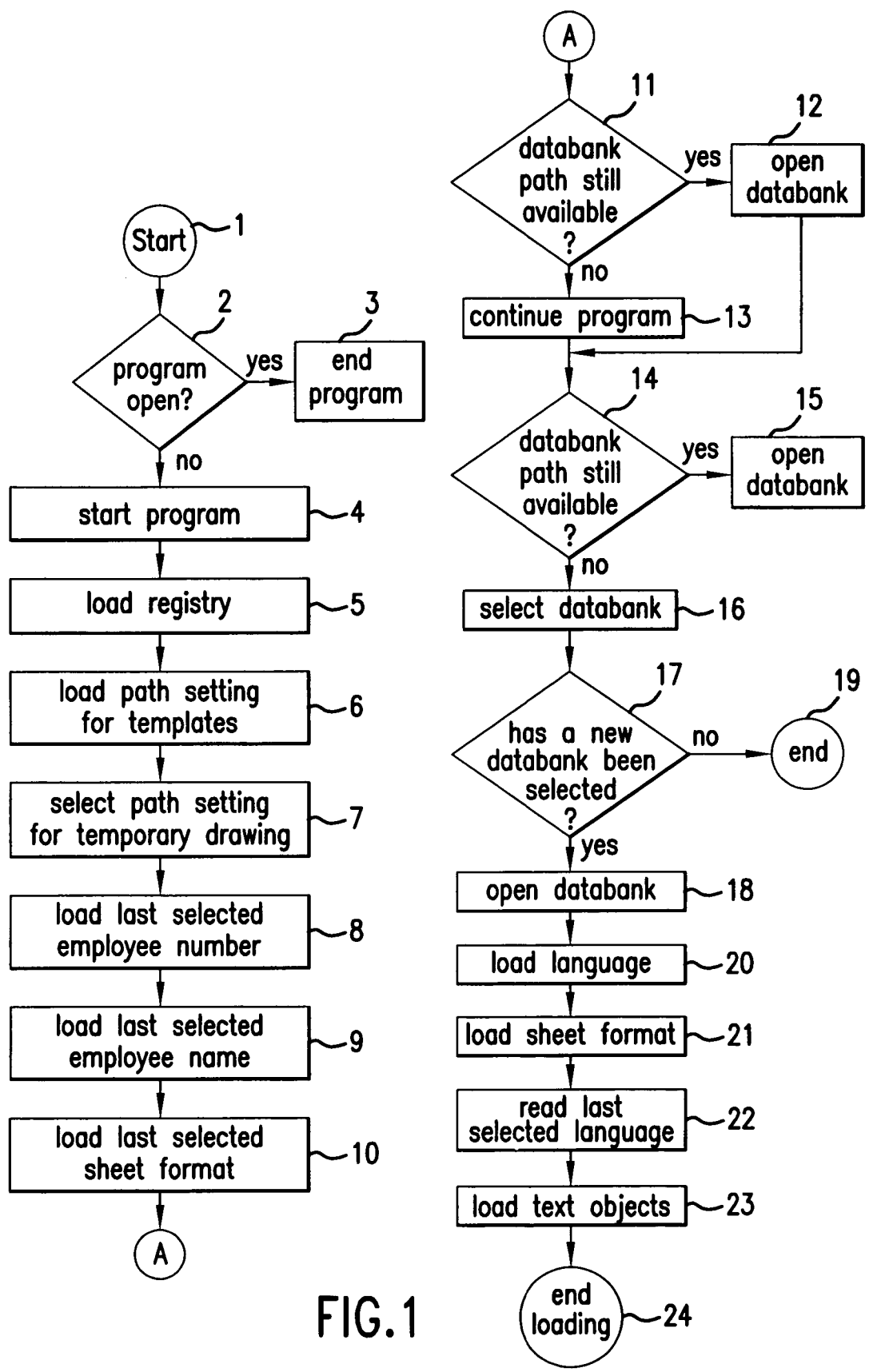

| | | | |
|---|---|---|---|
| 6,206,001 B1* | 3/2001 | Garber et al. | 128/204.21 |
| 6,619,112 B2* | 9/2003 | Juhasz | 73/168 |
| 6,772,103 B1* | 8/2004 | King | 703/7 |
| 6,829,551 B2* | 12/2004 | Von Der Hardt et al. | 702/114 |
| 2001/0027385 A1* | 10/2001 | Brown | 703/9 |
| 2003/0225555 A1* | 12/2003 | Gurumoorthy et al. | 703/9 |
| 2006/0190221 A1* | 8/2006 | Bennett | 703/1 |

FOREIGN PATENT DOCUMENTS

| | | |
|---|---|---|
| EP | 0801355 A2 | 10/1997 |
| EP | 0869450 A2 | 10/1998 |

OTHER PUBLICATIONS

Jihie Kim et al. "Knowledge-Rich Catalog Services for Engineering Design." AI EDAM, vol. 17, Issue 4. ©Sep. 2003. Abstract only. Available at http://journals.cambridge.org/action/displayAbstract?fromPage=online&aid=234981.*

Aldous, K.J.; "A System for the Automatic Retrieval of Information from a Specialist Database" *Information Processing & Management*, 32(2), pp. 139-154, (1996).

Wolski, A.; "Linda: A System for Loosely Integrated Databases" Data Engineering, 1989, Proceedings. Fifth Int'l Conf., Los Angeles, CA. Feb. 6-10, 1989 IEEE, pp. 66-73.

Yoo, M. et al.; "Debbie: A Configurable User Interface for CAD Frameworks" Proceedings of the Int'l Conf. on Computer Design, 1990, IEEE Comp. Soc. Press, U.S.A., pp. 135-140.

* cited by examiner

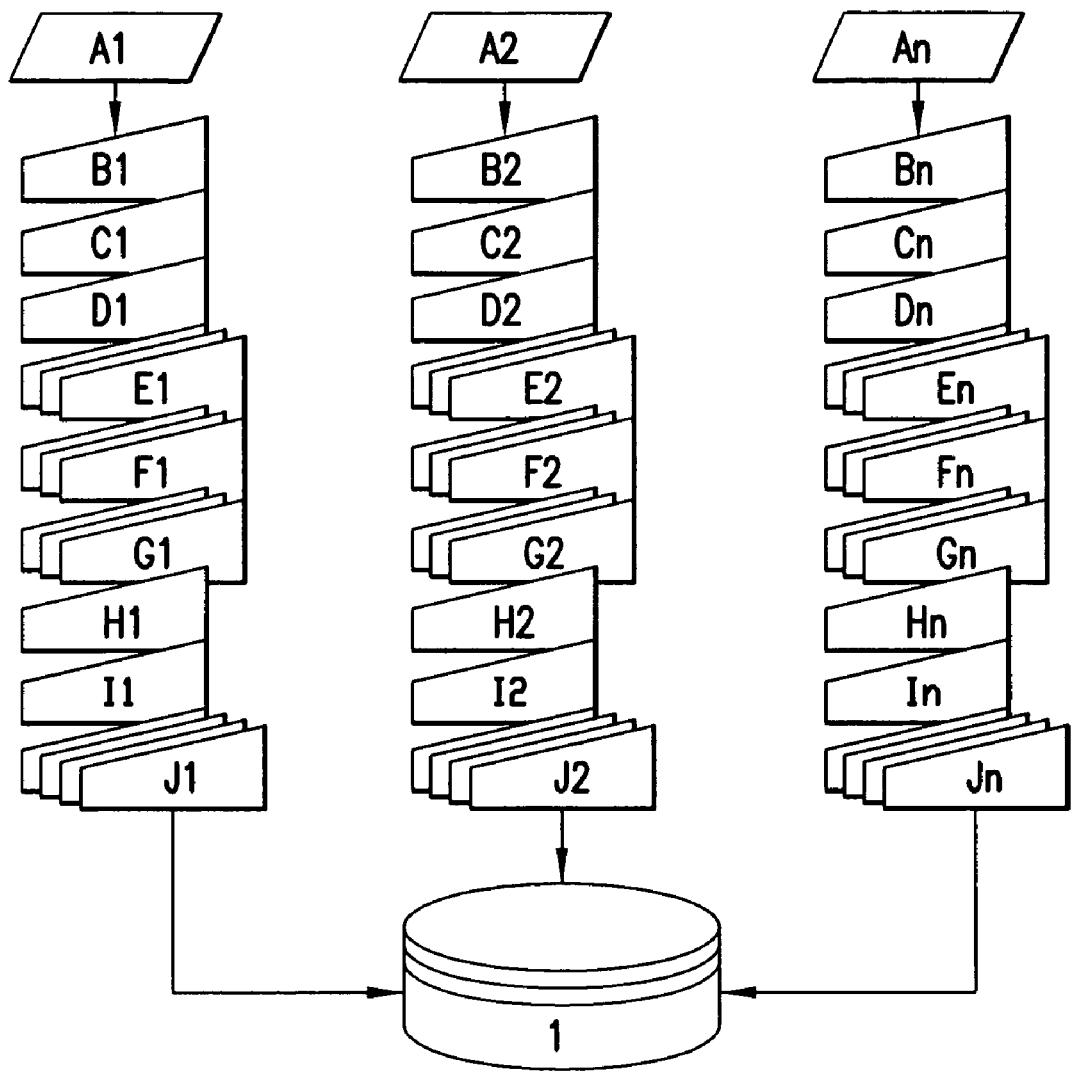

Ai = Position no. (e.g., Pos1, Pos 2, Pos 11)
Bi = Structural module code (e.g., BA001, BB0H1)
Ci = Drawing version
Ei = Partial description in various languages
Fi = Technical specifications (e.g., volume requirement)
Gi = Dimensional limitations (e.g., tube internal diameter)
Hi = Manufacturing cost
Ii = Sales price
Ji = Technical regulation/licencing (e.g., for the beverage field Y/N, for the pharmaceutical field Y/N, for ventilation Y/N, for liquids Y/N, for gases Y/N), WHEREIN = 1...n

FIG.10

Ai = Position no. (e.g., Pos1, Pos 2, Pos 11)
Bi = Structural module code family (e.g., AA, BB)
Ci = Product family (e.g., mini single housing, standard triple housing)

METHOD, COMPUTER PROGRAM PRODUCT AND COMPUTER SYSTEM FOR THE AUTOMATIC PRODUCTION OF A FILTER UNIT

DESCRIPTION

The present invention relates to a method, a computer program product and a computer system for automatically producing a filter unit comprising a plurality of components or elements.

It is known in the art to produce a filter unit manually from a plurality of components. For this purpose, the data are typically obtained by an external sales person at a customer site and are forwarded to the design department via Technical Support. The design department checks whether the customer's requirements are feasible and, if necessary, consults with the customer through Technical Support and the external sales person. Generating the necessary drawings (e.g., production drawing and dimensional drawing) usually requires 2 to 3 weeks.

Thus, the object of the present invention is to propose a method, a computer program and a computer system that permit an efficient production of a filter unit.

According to the invention, this object is attained by a method for automatically producing a filter unit comprising a plurality of components or element in accordance with claim 1 by means of a computer program product in accordance with claim 11 and by means of a computer system in accordance with claim 12. Preferred embodiments of the invention are set forth in the dependent claims.

The invention provides a method for automatically producing or assembling a filter unit comprising a plurality of components or elements or modular elements, which includes the following steps:

Selecting a field of application of the filter unit to be produced from among a plurality of predefined or predefinable fields of application and/or selecting a design of the filter unit to be produced from among a plurality of predefined or predefinable designs, generating an input field as a function of the selection made, in which input field only those entries are enabled which correspond to the selection made;

checking whether the entries in each input field are mutually compatible, i.e., by retrieving or calling datasets that correspond to the entries and that are stored in a database or a data memory area, wherein the step of checking comprises a step of automatically generating an error message if the entries in each input field are not mutually compatible.

Thus, the single or multiple step selection to be made permits an advantageous filtering of the components that are assembled into the filter unit, so that even an untrained employee can produce a filter unit automatically or in an automated manner. Furthermore, through the preferred classification of the components in a data structure that represents a modular system, or the selection of the components from such a modular system, a simple technical implementation is provided for generating and producing a quotation.

According to a preferred embodiment of the present invention, the generating step comprises a step of determining the number of datasets corresponding to the selection made.

Preferably, the generating step comprises a step of generating input fields that are to be sequentially processed. These input fields that are to be sequentially processed correspond at least partially to the respective components of the filter unit to be produced.

Furthermore preferably, only those components are available for selection, and can therefore be input or called up in the input fields to be sequentially processed, which correspond to the selection made.

As a consequence, input errors can be immediately identified and suitably corrected. For correction, the system preferably automatically provides suggestions on how to correct an incorrect input.

Furthermore preferably, the retrieved datasets are technical characteristics of the components that were selected in the corresponding input fields. These characteristics preferably comprise one or more dimensions of the individual components.

The user is therefore alerted to any incorrect input or selection of components.

According to a further preferred embodiment, the design of the filter unit to be produced is selected as a function of at least one of the following parameters: the number of filter unit chambers, the desired volume or volume area of a housing of the filter unit, the desired filtration rate of the filter unit, a filtration module or a filter cartridge used, the inside pipe diameter of individual components, the type of ventilation of the housing.

Preferably, the field of application of the filter unit to be produced is selected as a function of at least one of the following parameters: use of the filter unit in a pharmaceutical application, use of the filter unit in a chemical application, use of the filter unit for filtering beverages, use of the filter unit for filtering gases, or use of the filter unit for filtering liquids.

Most preferably, the method further comprises a step of generating a drawing on a display device or a readable medium as a function of the selected or entered components.

The invention further provides a computer program product for automatically producing a filter unit comprising a plurality of components or elements. This computer program can be loaded directly or indirectly into the internal memory of a computer. It comprises coding segments that can execute a method for automatically producing a filter unit that comprises a plurality of components or elements in accordance with the invention or an embodiment thereof.

The invention further provides a computer system for automatically producing a filter unit that comprises a plurality of components or elements. This computer system includes a memory unit, an evaluation unit, an input unit, and an output unit. The input unit has means for selecting a field of application of the filter unit to be produced from among a plurality of predefined or predefinable fields of application and/or means for selecting a design of the filter unit to be produced from among a plurality of predefined or predefinable designs. The evaluation unit has means for generating an input field on the display device as a function of the selection made. In this input field, only those inputs are enabled which correspond to the selection made. The evaluation unit further has means for checking whether the entries made in each input field are mutually compatible, i.e., by retrieving or calling up datasets that correspond to the inputs and that are stored in a database or a data memory area. The evaluation unit further comprises means for automatically generating an error message if the entries made in each input field are not mutually compatible.

Figure 2:
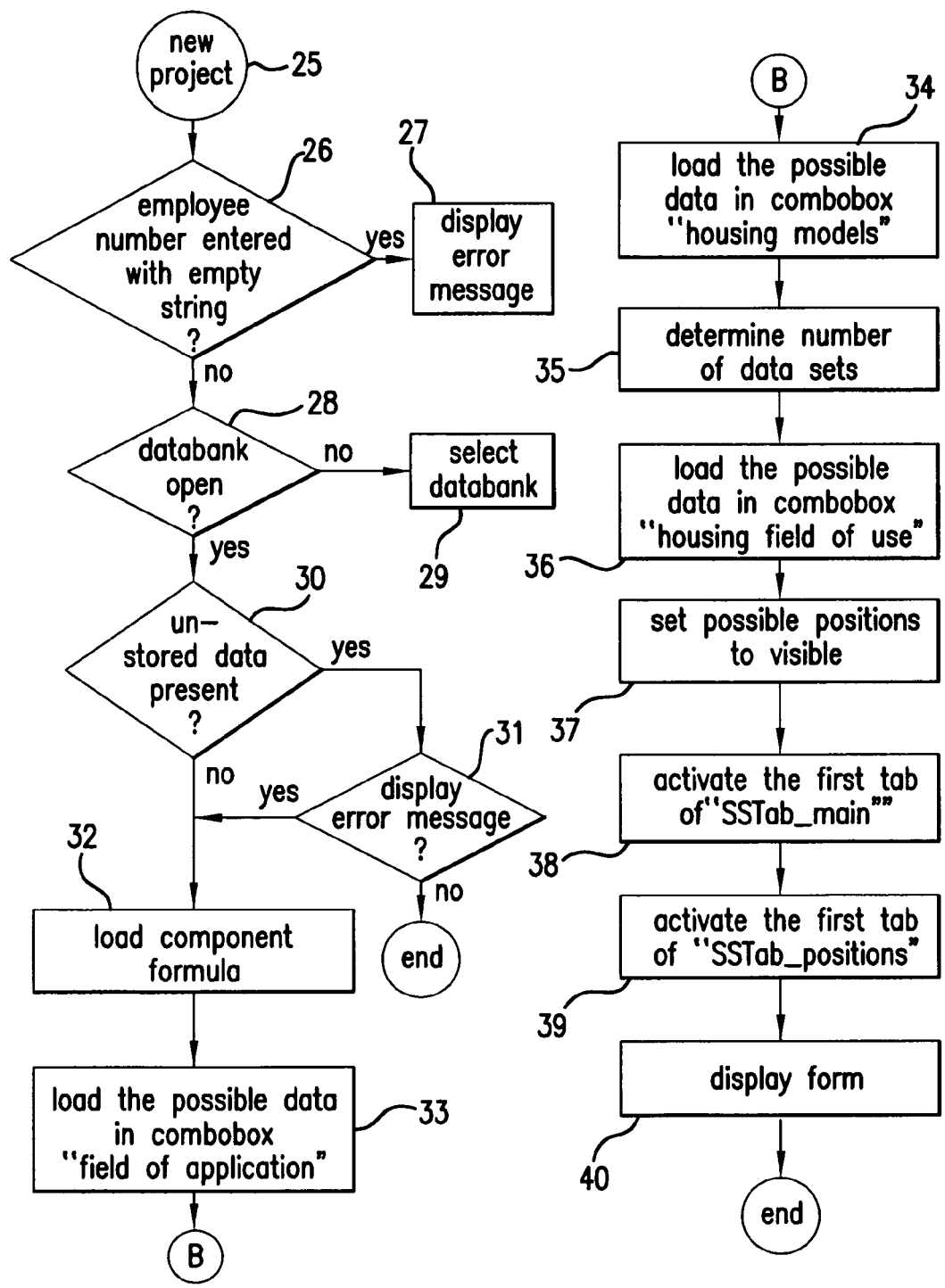
Figure 3:
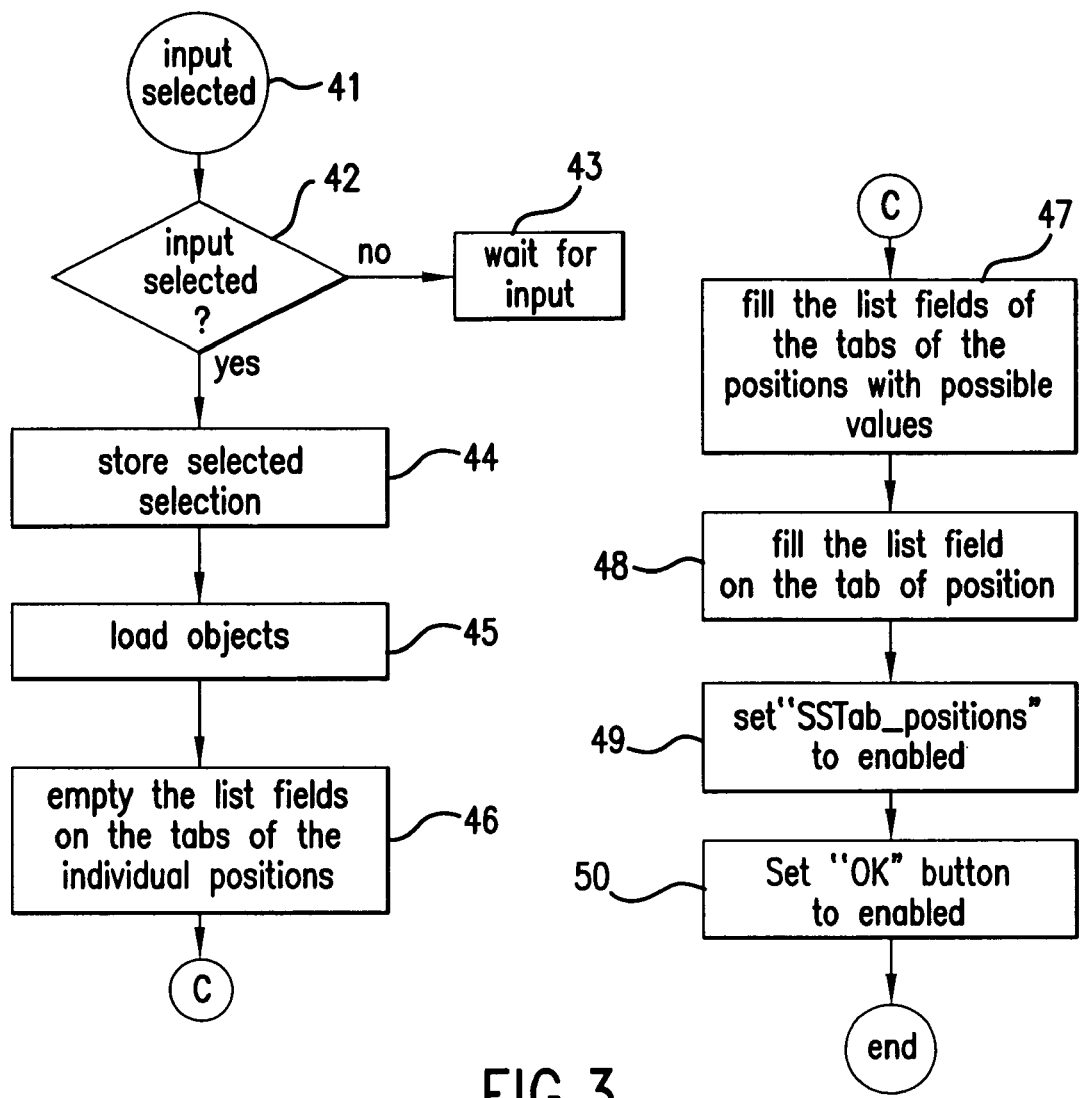
Figure 4:
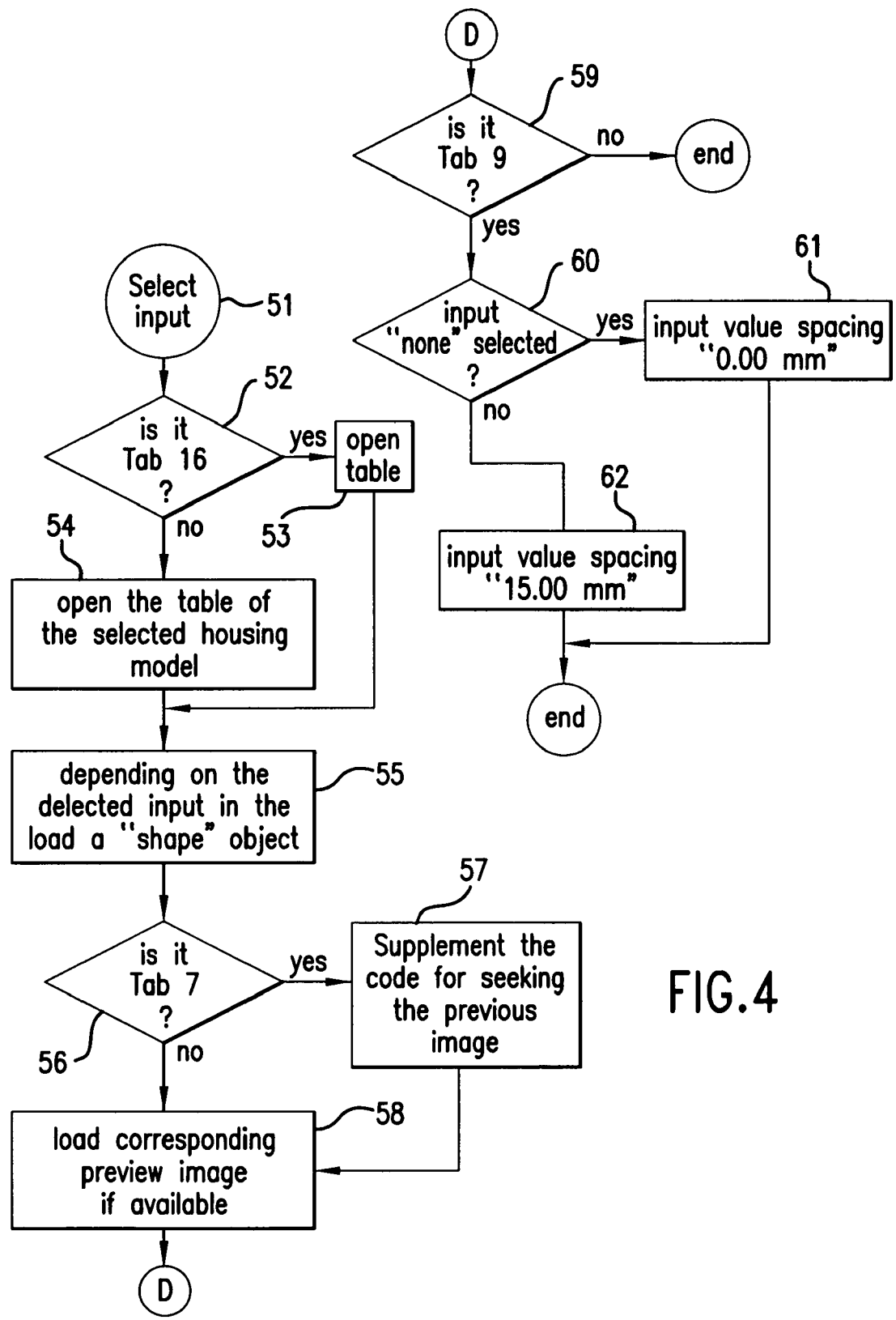
Figure 5:
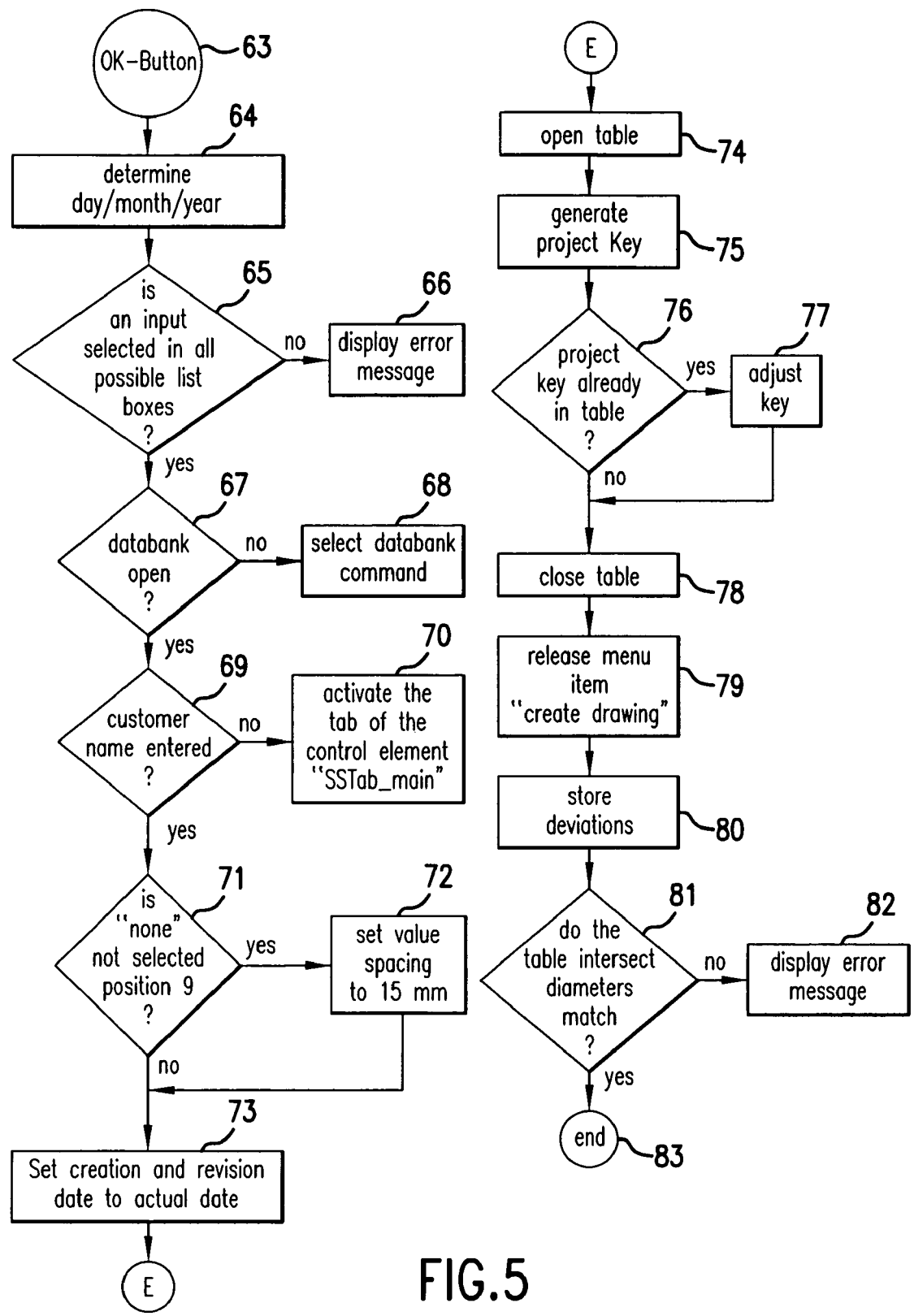
Figure 6:
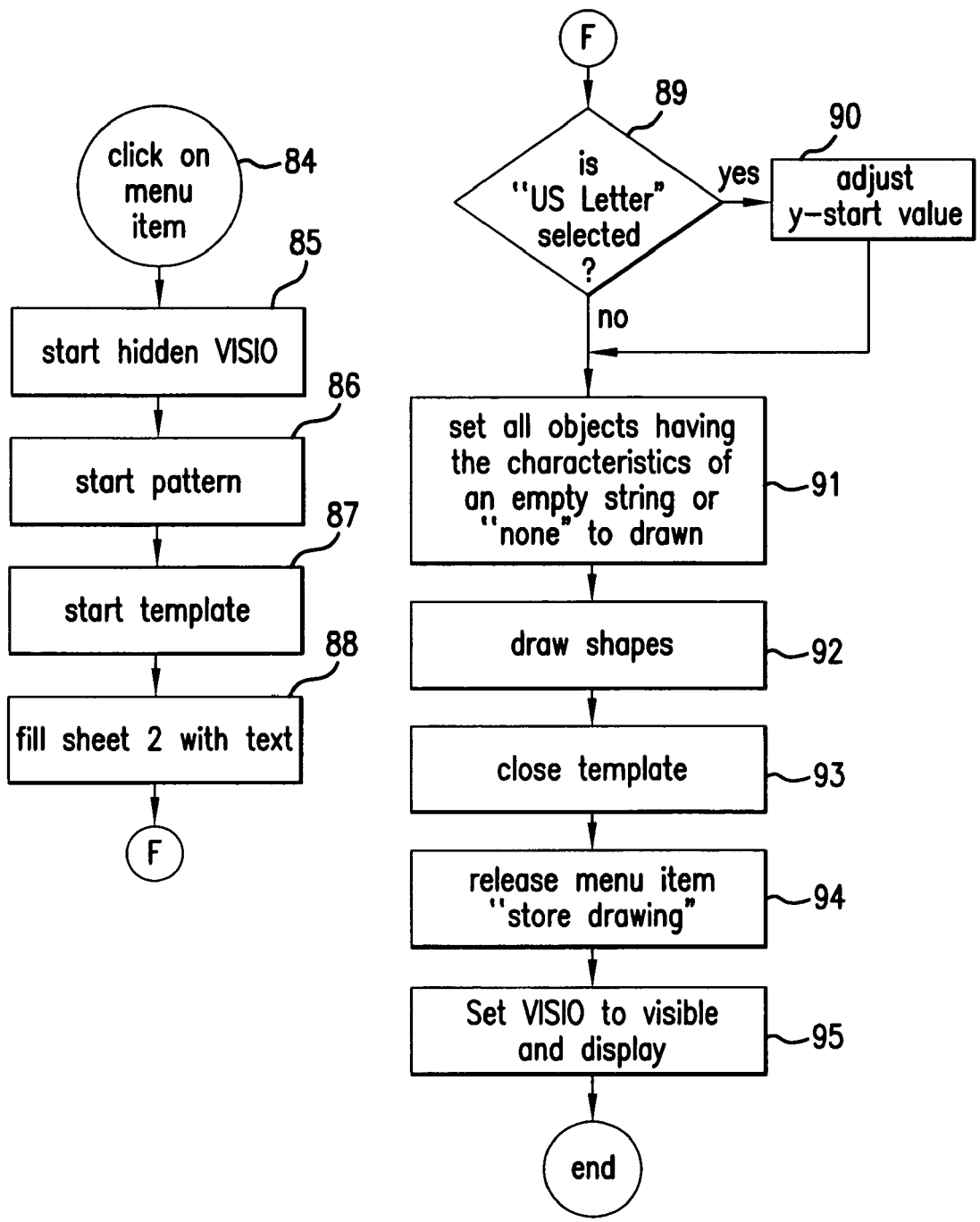
Figure 7:
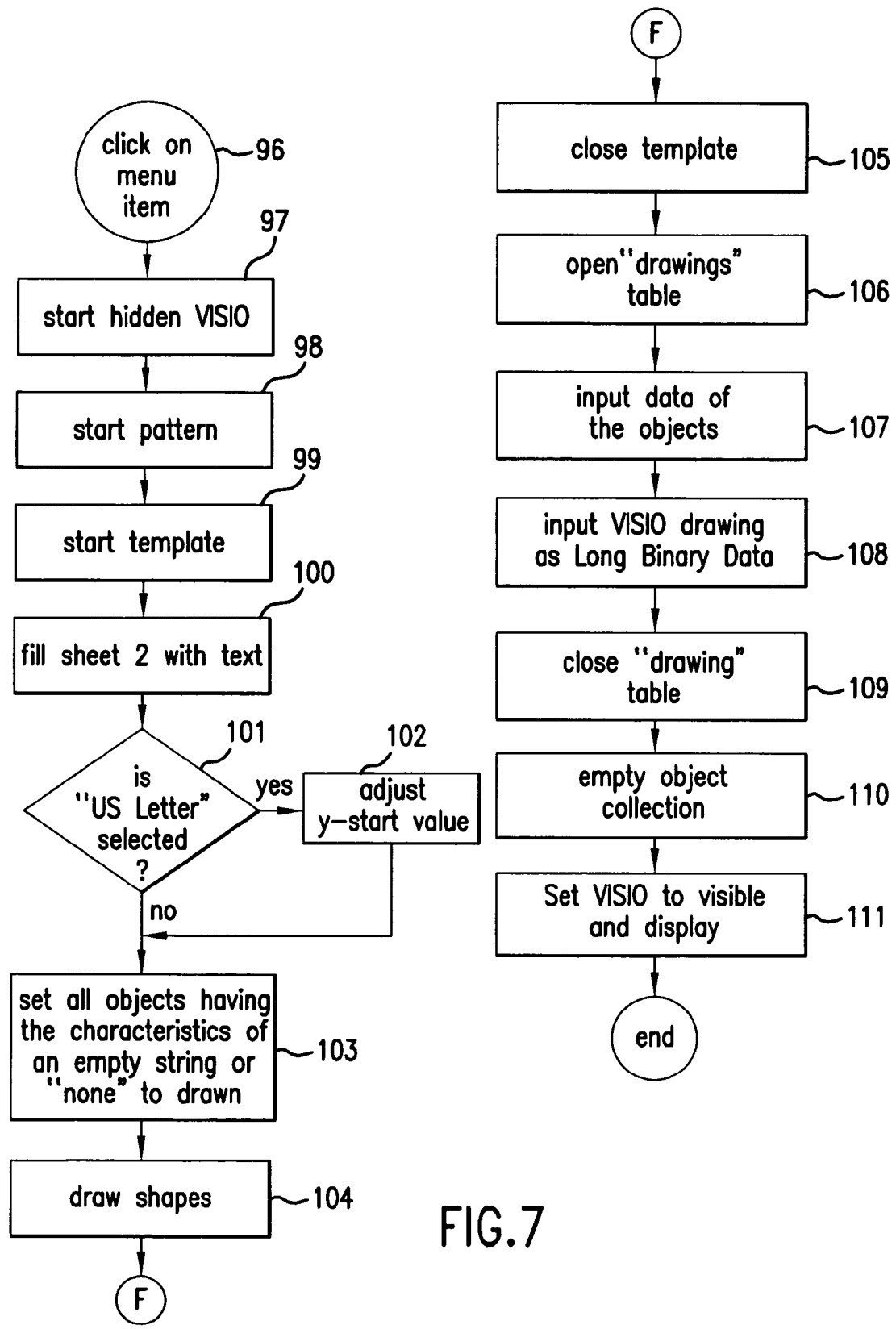
Figure 8:
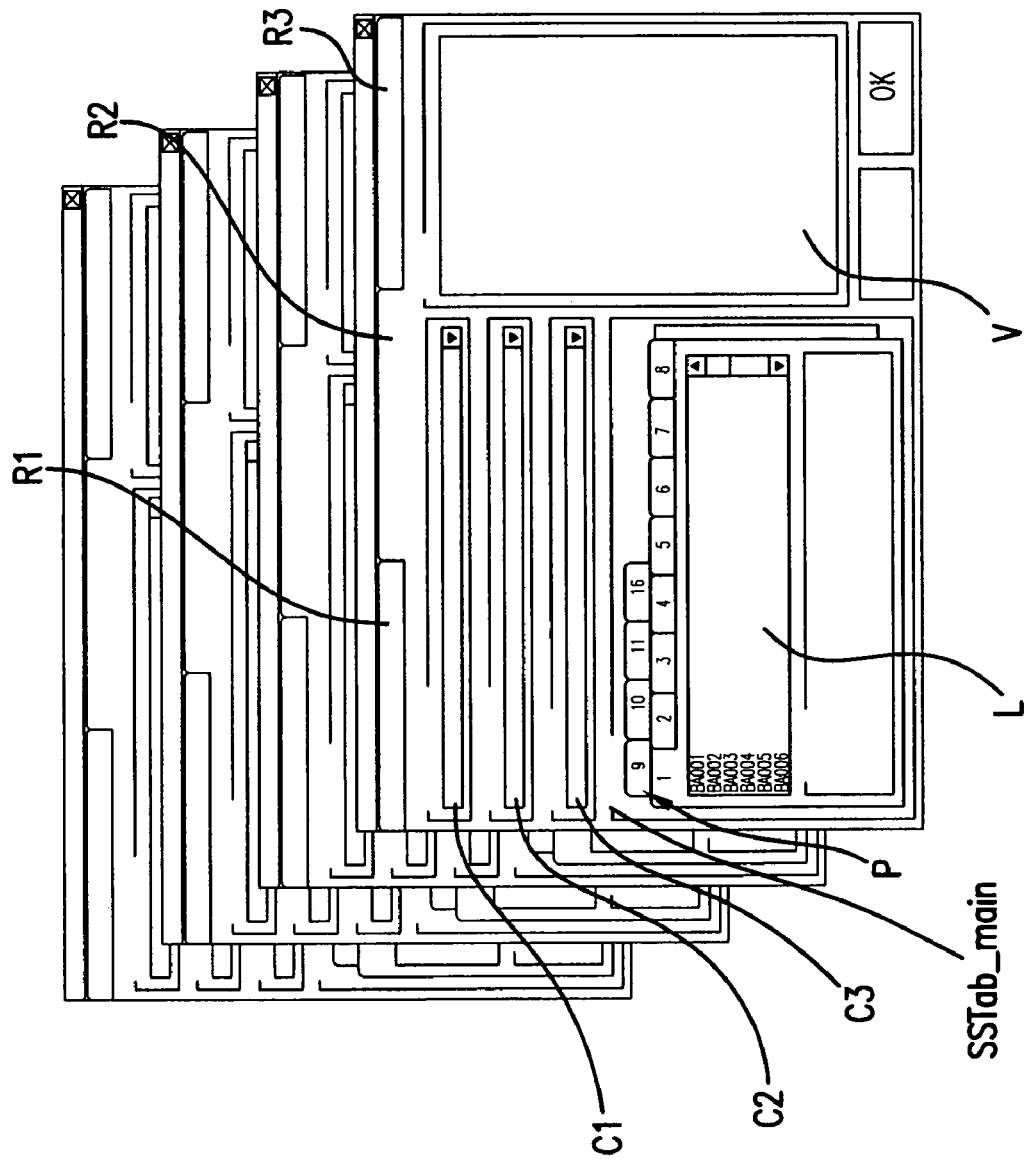
Figure 9:
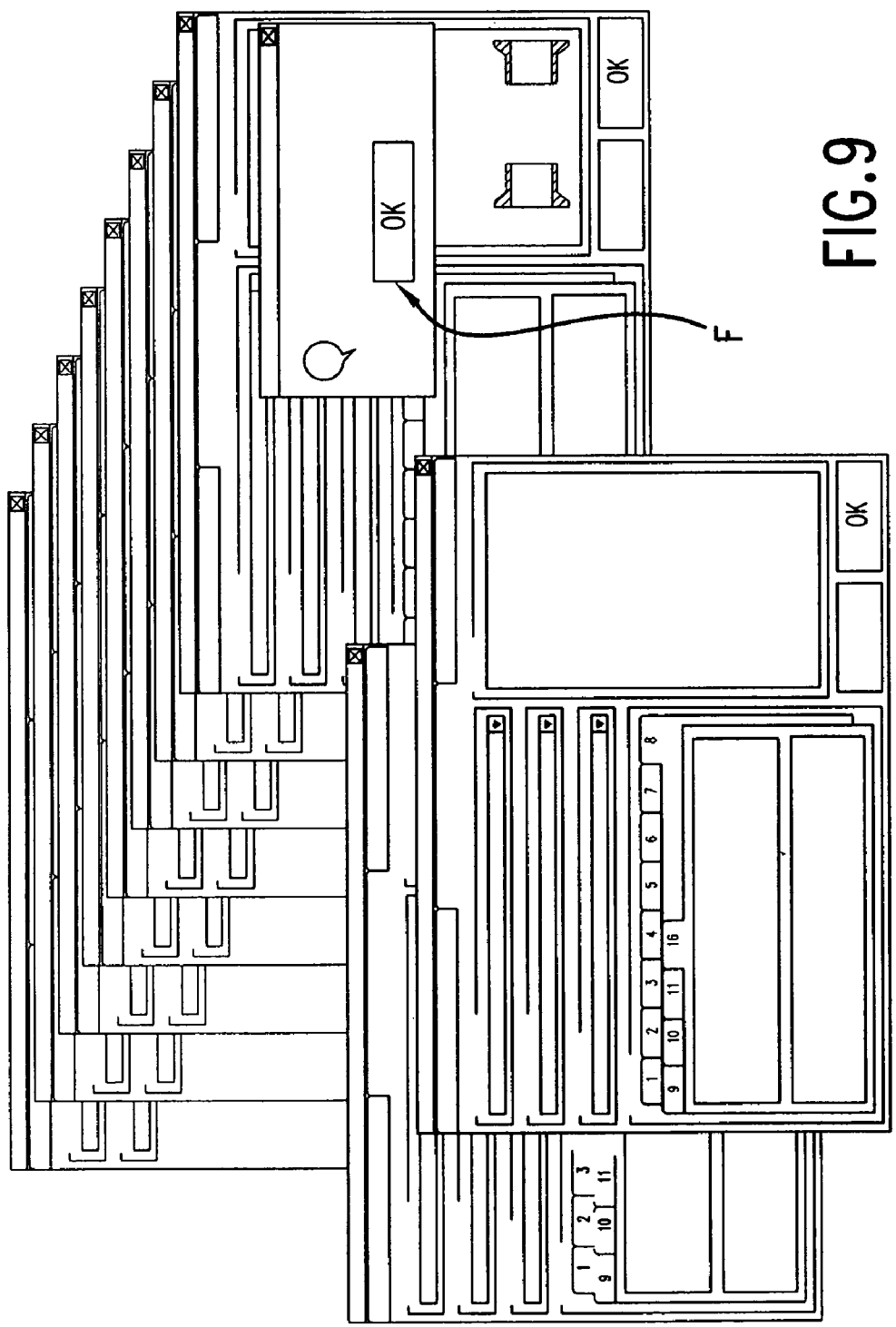
Figure 11:
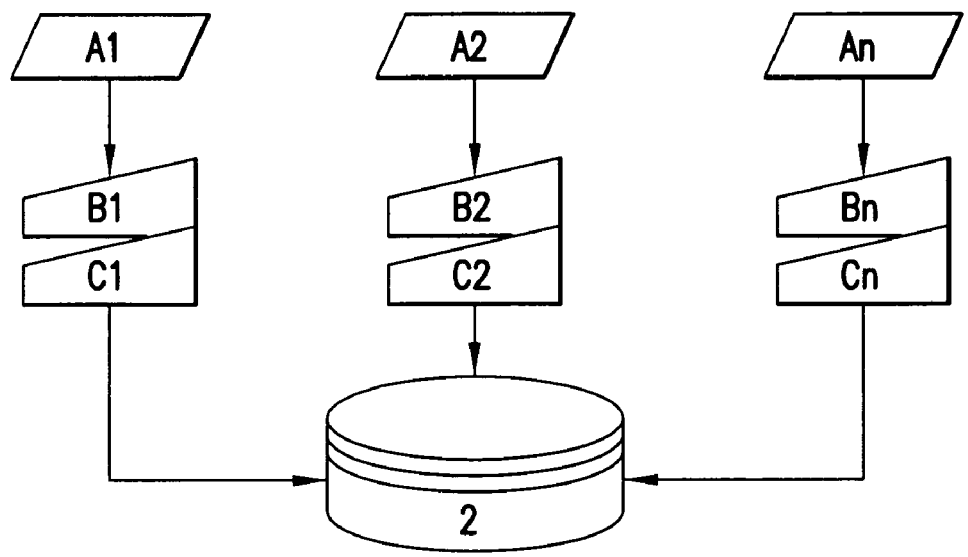
Figure 12:
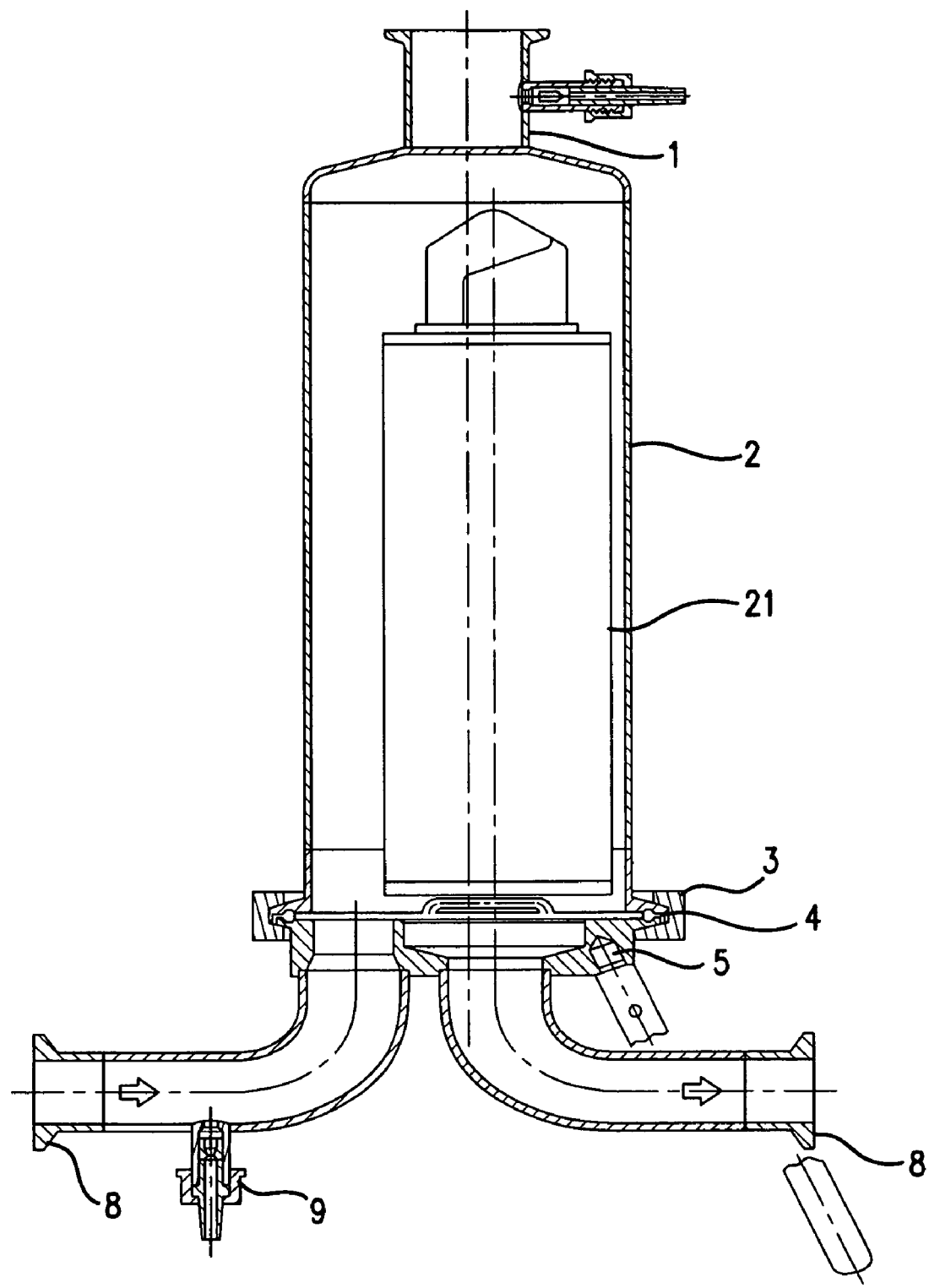
Figure 13:
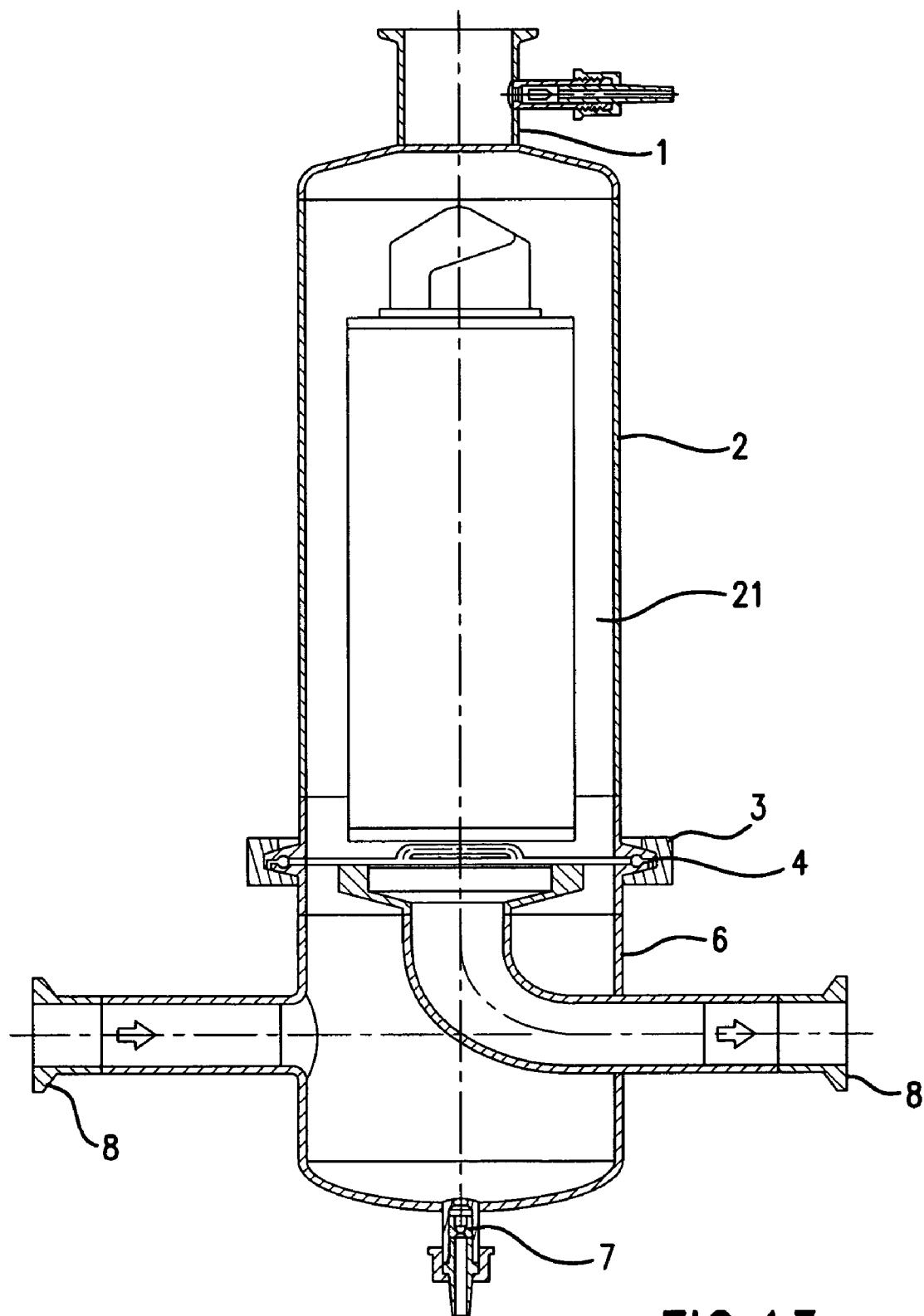

Additional objects, advantages and features of the present invention will now be described in greater detail, by way of example, with reference to preferred embodiments depicted in the drawing in which:

FIG. 1 is a flow diagram depicting the starting or loading process of the program in accordance with a preferred embodiment of the invention, FIG. 2 is a flow diagram depicting the process or (sub) program flow when a new project is created according to a preferred embodiment of the invention, FIG. 3 is a flow diagram depicting the process or (sub) program flow in accordance with a preferred embodiment after a form has been generated, FIG. 4 is a flow diagram depicting the process or (sub) program flow in accordance with a preferred embodiment after a predefined or predefinable input (SSTab) has been selected from a table, FIG. 5 is a flow diagram depicting the process or (sub) program flow in accordance with a preferred embodiment after an additional check of the data entered or determined in the input form, FIG. 6 is a flow diagram depicting the process or (sub) program flow in accordance with a preferred embodiment after a command has been entered to generate a drawing of the determined filter unit, FIG. 7 is a flow diagram depicting the process or (sub) program flow in accordance with a preferred embodiment after a command has been entered to save a drawing, FIG. 8 shows an example of a graphic display of an input form for entering or determining the individual components of the filter unit, FIG. 9 shows an example of an error message of the process or (sub)program flow depicted in FIG. 5, FIG. 10 shows a component database structure for use with a preferred embodiment of the invention, FIG. 11 shows an allocation database for use with a preferred embodiment of the invention, FIG. 12 shows an example of a filter unit for liquid media, which comprises a plurality of components from a modular system, and FIG. 13 shows a further example of a filter unit that is suitable for a gaseous medium.

According to a preferred embodiment of the invention, a computer program product and a method are provided, which make it possible to assemble a filter unit, particularly a filter housing, comprising a plurality of parts or elements or components.

FIG. 1 depicts a starting or loading process of the program, i.e., the steps executed when the program is selected and immediately thereafter, according to a preferred embodiment of the invention. Step 1 designates the program start. Step 2 checks whether an instance of the program is already running on the computer. If this is the case (YES in step 2), the newly started program is terminated in step 3. If no instance has been initiated on the computer (NO in step 2) the so-called "splash form" is opened in step 4, displaying a logo, the current time, the current date, the version number of the program and/or subsequently the selected user data, e.g., employee ID and the selected employee name.

In step 5, the path for preview images is loaded or read or called up from a registry or a data memory area. If such a path does not exist, a predefined or predefinable default (e.g., "c:\programs\sartorius\preview\") is selected or read.

In step 6, the path for one or more displays (so-called "templates") is loaded from the registry or a data memory area. If such a path does not exist a predefined or predefinable default (e.g., "c:\programs\sartorius\templates and screen forms\" is selected.

In step 7, the path for temporary drawings is loaded from the registry or a data memory area. If it does not exist, a predefined or predefinable default (e.g., "c:\windows\temp\") is selected.

In steps 8 and 9, one or more of the most recently entered or selected user data is loaded from the registry or a data memory area, e.g., in step 8 the most recently selected employee ID, or in step 9 the most recently selected employee name. If no user data exists, an empty string is loaded in the corresponding step or sub-step.

In step 10, one or more of the most recently selected format data is loaded from the registry or a data memory area. If no dataset exists, a predefined or predefinable format dataset (e.g., "DIN A4") can be loaded from the registry or a data memory area.

In step 11, a project database (e.g., "projects.sag") or a project data memory area is accessed, in which the previously generated or processed projects and corresponding references and/or project-related data is stored. In particular, this step queries or checks whether the corresponding project database or the corresponding project data memory area, particularly "projects.sag" exist under the path or under the reference stored in the registry. If a stored path or reference exists (YES in step 11), the corresponding project database, particularly "projects.sag" is opened in step 12 or the corresponding data is read. If on the other hand no stored path or reference exists (NO in step 11, the program is continued in step 13, in which case the project database can preferably be selected later. The main screen (MDI) is preferably opened to its maximum in step 13.

Furthermore, step 14 queries or checks whether another database (e.g., "Sartorius.sag") or a data memory area exists or is available under the path stored in the registry. If the query in step 14 is positive, the corresponding additional database (e.g., "Sartorius.sag") is opened or the corresponding data memory area is read in step 15. If on the other hand the query in step 14 is negative, a prompt is started in step 16 to select a new database, particularly "Sartorius.sag," or a new data memory area. In this new database, particularly in "Sartorius.sag," or in the new data memory area, the data that is necessary to supply or load the program with all the database information for the data memory area is stored.

Step 17 checks whether a new database, e.g., "Sartorius.sag" or a new data memory area has been selected. If a new database, e.g., "Sartorius.sag" or a new data memory area has been selected (YES in step 17) this database is opened or the corresponding data memory area is read in step 18. If on the other hand no new database, e.g., "Sartorius.sag" or no new data memory area has been selected (NO in step 17), the program is terminated in step 19 since the program cannot run without the data stored in the database or in the data memory area.

In step 20, objects of the type "language" are loaded into a data memory area "languages." The object "language" has preferably only the property "language name" (e.g.: "German"). The objects are loaded from a table "general: translation", which will be described in greater detail below. Each object contains the name of a column of the table.

In step 21 one or more objects of the type "format" are loaded into a data memory area "formats." The object "format" preferably has only the property ("format name" (e.g., "DIN A4"). The objects "format" are loaded from the table "general: page formats," which will be described in greater detail below. Each object contains one entry of the first column of the table.

In step 22, the most recently selected language for the program interface is read from the registry or the data memory area. If no entry is found, a predefined or predefinable language (e.g., "German") is selected. The selected language is preferably stored in the registry or the corresponding data memory area. If in step 22 the language is changed from the previously stored language, an event is triggered in this step which is received by each form, and the language of the information contained in each form is immediately adapted. As an alternative or in addition thereto a corresponding language flag can be set.

In step 23 objects of the type "text" are loaded into a data memory area "texts." The object "text" preferably has only the property "text." The objects are preferably loaded from the table "general: translation." Each object contains one entry of the second column of the table. It is stored under a key that corresponds to the value in the first column of the table.

In step 24 the loading process Of the program is completed.

If, after the program has been started, a menu item ("new project" is selected as a command for automatically generating or producing a filter unit, the following steps are executed in a preferred embodiment (FIG. 2).

In step 25, the program reads or waits for the instruction "new project." If this instruction has been received, e.g., through selection in a corresponding pulldown menu, step 26 checks whether en empty string is entered under the user data (e.g., employee ID) or whether the entered string does not have a predefined or predefinable minimum length (e.g., 4 characters). If the result of this discrimination is positive (YES in step 26), an error message is automatically output in step 27, e.g., a message box with a corresponding error text is displayed. After acknowledgment of the error message (e.g., after an OK button has been clicked), a corresponding form is opened where user data, e.g., an employee ID, can be entered. If the result in step 26 is NO, step 28 checks whether the project database (e.g., "projects.sag") is open or a corresponding project data memory area is available or has been read. If the result in step 28 is NO, a prompt to select a project database (e.g., "projects.sag" is initiated. If no project database is selected, the prompting procedure is quit, i.e., no project database is read. If, on the other hand, step 28 determines that a project database is open (YES in step 28), step 30 checks whether data that has not previously been stored is loaded. If this is the case (YES in step 30), a corresponding error message is automatically output in step 31, e.g., a corresponding message box with an appropriate error text (e.g., "delete unsaved data") is displayed and an input prompt is preferably started (e.g., YES/NO). If, for instance, "NO" is clicked, the program is quit. If "YES" is clicked in step 31, the program goes to step 32.

If the program determines in the discrimination of step 30 that there is no unsaved data (NO in step 30), an element or component form is loaded or displayed in step 32 by means of which the filter unit component data can be entered or determined. This component form preferably comprises two SSTab control elements (tabs). The first "SSTab_main" (e.g., 3 tabs) makes it possible (see FIG. 8) to enter e.g., customer-specific data on the first tab R1, project-specific data on the second tab R2 with the aid of the second SSTab control element "SSTab_items," and e.g., any project-specific deviations and project-specific remarks on the third tab R3 of the SSTab control element "SSTab_main". Fewer or more tabs may be provided depending on the specifications of the filter unit.

In step 33, the data available or possible for selection is loaded into the combobox C1 (e.g., "fields of application"). Depending on the language selected in step 22, this data is translated by loading the corresponding stored data or is displayed in the selected language. The data to be or being displayed in combobox C1 is loaded from the table "general: fields of application." It comprises the entries of the column "fields of application" of the corresponding table. The combobox C1 thus enables the user to select, e.g., the fields of application of the filter unit to be produced (e.g., "pharmaceutical application" for filter units that are intended for the pharmaceutical industry, or "beverages" for filter units for the beverage industry).

In step 34, the available or possible data is loaded into the combobox C2 (e.g., "housing designs"). This data, too, is translated depending on the selected language. The data to be or being displayed in combobox C2 is loaded from the table "general: housing designs." It comprises all the column names of the corresponding table. Thus, combobox C2 enables the user to select, e.g., the design of the filter unit, e.g., whether the filter unit has one or more filtration modules, small, medium or large filtration modules, and/or whether the housing design is of the ventilation, gas and/or liquid type.

In step 35, the number of datasets in the corresponding table is determined. This number represents the number of possible items P (FIG. 8) of the filter unit to be produced.

In step 36, the possible data is loaded into the combobox C3 (e.g., "housing applications"). This data is also translated depending on the selected language or is displayed in the selected language. The data to be or being displayed in combobox C3 is loaded from the table "general: housing application." This data corresponds to or contains the entries of the table column "housing application".

In step 37, depending on the number of possible items P determined in step 35, the corresponding tabs of the control element "SSTab_items" are set to visible (e.g., by bolding the corresponding item numbers on the tabs).

In step 38, the first tab of the SSTab control element "SSTab_main" is activated and in step 39 the first tab of the SSTab control element "SSTab_items" is activated.

In step 40, the determined or generated input form is displayed or enabled for input.

After the input form has been generated or enabled, the program waits for an entry in one or more fields, particularly in the comboboxes C1-C3.

If an entry is made in step 41 (FIG. 3), e.g., an entry is selected in one of the three comboboxes C1-C3, step 42 checks whether the other fields of the input form have been filled in, e.g., if an entry has already been selected in the other two comboboxes.

If step 42 determines that some entries are still missing (NO in step 42) the program waits for one or more corresponding entries. If on the other hand step 42 determines that all the necessary entries have been made (YES in step 42) the selected or entered data (e.g., the selected field of application, the selected housing design and the selected housing type) is stored in step 44.

In step 45, depending on the housing design selected or determined in combobox C2, the corresponding objects of the type "tab" are loaded into the "tabs" collection. The object "tab" preferably has only the property "name" (e.g., a product-specific designation "BA-o"). The corresponding objects are loaded from the table "general: housing designs." Each object contains an entry of the column of the selected housing design of the table. The selected object is preferably stored under the key that corresponds to the value in the table column "item."

In step 46, the list fields on the tabs of the individual items P are preferably emptied, since a change in the entries, e.g., in comboboxes C1-C3, particularly a change in the combination of field of application, housing design and housing type, is possible at any time, i.e., it is not blocked.

In step 47, the list fields on the tabs of items P are filled with possible values from the "code" column and the tabs are set to enabled=true where the tab object to be found under the item number does not contain an empty string under the property "name."

In step 48 the list field on the tab of item 16 (e.g., "certificates") is filled with the values of the column "code-" and "selected language" from the table "general: certificates."

In step 49, the SSTab control element "SSTab_items" is set to enabled=true. In step 50 the "OK" button is set to enabled-true.

In step 51 (FIG. 4) an entry is selected in a list box on an SSTab control element "SSTab_items." Step 52 checks whether the correspondingly selected tab represents a first predefined or predefinable tab of a tab series of items P (e.g., tab 16 in the example of FIG. 8). If the last tab of the tab series was selected (YES in step 52) the table "general: certificates" is opened in step 53 and the description found under the selected entry in the selected language is loaded into the label field found under the list box. If the answer in step 52 is NO, the table of the selected housing design is opened or loaded in step 54 and the description found under the selected entry is loaded preferably in the selected language into the label field L found under the list box (FIG. 8).

In step 55, depending on the selected entry in the list box, an object of the type "shape" is loaded into a collection "shapes." This object of the type "shape" preferably has the following properties: "code," "selling price," "description," "key," "drawing No.," "drawn," "inside pipe diameter" and/or "rated capacity." The objects are loaded from one of the above open tables. Each object is stored under the key that corresponds to the value of the "item."

Step 56 determines or checks whether the tab corresponds to a second predefined or predefinable tab of the tab series (e.g., tab 7). If true (YES in step 56), the corresponding preview code is changed or marked for the search of the preview picture (e.g., is supplemented by a "u") in step 57. If on the other hand the tab does not correspond to the second predefined tab (NO in step 56) the preview picture corresponding to the code, if it exists, is loaded into the corresponding preview field V in step 58.

Furthermore, step 59 checks whether the tab corresponds to a third predefined or predefinable tab (e.g., tab 9). If there is no correspondence (NO in step 59), this (sub)program run or this subroutine is terminated. If, however, the tab corresponds to the third tab (YES in step 59), step 60 checks whether the entry "none" is selected in the list box. If yes, a predefined or predefinable first valve distance (e.g., "0.00 mm" as the valve distance) is entered or stored and/or displayed in step 61. If on the other hand the entry "none" is not selected (NO in step 60), a second predefined or predefinable valve distance (e.g., "15.00 mm" as the valve distance) is entered or stored and/or displayed in step 62.

After completion of the routine depicted in FIG. 5 the program waits until a release is entered, e.g., by clicking an "OK" button in the input form. If the release is entered in step 63 (e.g., the "OK" button is clicked), a time stamp is determined in step 64 (e.g., year/month/date).

Step 65 checks whether an entry has been selected in all possible list boxes on the control element "SSTab_items" or in the corresponding item fields of the form. If this is not the case (NO in step 65) a corresponding error message is output (e.g., a message box with a corresponding error text is displayed). The program then preferably waits for an acknowledgment of the error message (e.g., clicking of the "OK" button), the corresponding tab is activated, and the subroutine or procedure is quit. If all entries were made (YES in step 65) step 67 checks whether a project database (e.g., "projects.sag") is open. If no project database is open (NO in step 67), a prompt to select a project database is generated in step 68. If no project database is selected, the procedure or subroutine is terminated or a new prompt is generated.

If a project database is open (YES in step 67) step 69 checks whether customer-specific data (e.g., customer name, address, number, etc.) has been entered. If this is not the case (NO in step 69) a first tab of the control element "SSTab_main" is activated in step 70. In the input form, the input field for the customer name is highlighted (e.g., by bolding, shading, opening of the corresponding field or the like) and the procedure or subroutine is quit. If, in contrast, customer-specific data has been entered (YES in step 69), step 71 checks that "none" has not been selected in a predefined item P (e.g., item 9). If yes, the valve distance is set to a predefined or predefinable value (e.g., 15 mm). If "none" is selected in the predefined item (NO in step 69) the project is date-stamped in step 73, and preferably a project-related created date and modified date is set to the current date.

In step 74, the table "drawings" in the project database is opened and a project key is generated in step 75. Step 76 checks whether this project key already exists in the table. If true (YES in step 76) the key is adapted accordingly. If the project key does not exist in the table (NO in step 76), the table "drawings" in the project database is closed in step 78.

A menu item "create drawing" is enabled in an input field in step 79. The values entered or selected in the form or in the corresponding form fields are renewably stored. In particular, only the divergent values are stored in step 80.

Step 81 checks whether the different selected or entered elements or components of the filter unit are mutually compatible. This is done by querying predefined or predefinable parameters of the individual components stored in the component database. It is possible, for instance, to check whether the inside pipe diameters of the individual adjacent components match, e.g., by querying the corresponding data fields F and/or G within the component database (FIG. 10). Alternatively or in addition, this query can be done by calling up a correspondence table, which contains information as to which components can be arranged next to other components. If the parameters do not match and/or an adjacent arrangement is not possible (NO in step 81) a corresponding error message F (FIG. 9) is generated (e.g., a message box with a corresponding error text is displayed). An acknowledgment of the error message is preferably prompted. If acknowledged (e.g., "OK" is clicked) at least one tab is activated which corresponds to the component that is incompatible with, or does not correspond to its neighbor, and the procedure or subroutine is quit.

If the parameters match and/or the adjacent arrangement is possible (YES in step 81) the procedure or subroutine is terminated in step 83.

A procedure or (sub)program flow or subroutine will now be described with reference to FIG. 6 if a command is entered to create a drawing of the filter unit, which is determined on the basis of the entries in the form field, e.g., by clicking a menu item "create drawing" in step 84.

In step 85, a drawing or CAD program (e.g., VISIO) is started, preferably hidden. In step 86 a predefined or predefinable template (screen form) is started, particularly by loading a default file. In step 87, depending on the filter unit characteristics selected in the corresponding field (e.g., based on the housing design selected in combobox C2) the corresponding template or screen form is started. If necessary, component characteristics (e.g., dimensions, data regarding volume and throughput etc.) can also be included in the drawing in step 88, e.g., the shapes can be filled with text in a page of the template (step 88). If it is determined that the selected format dataset does not correspond to the loaded template (e.g., by the query "US letter" selected? in step 89) the data of the template is correspondingly adapted (e.g., by adapting the Y starting value in step 90). Alternatively, the template corresponding to the selected format dataset can be loaded.

In step 91, all objects of the type "shape" in which the property "code" contains either an empty string or the word "none" are set to drawn=true. Subsequently, in step 92, the corresponding shapes (drawing elements and/or text) are drawn, and in step 93 the template is closed.

In step 94, a menu item "save drawing" is enabled and after the corresponding acknowledgment the drawing is stored. In step 95, the drawing program, particularly VISIO, is set to visible and the created drawing is displayed.

The command "save drawing" preferably starts the subroutine depicted in FIG. 7 in step 96. If not already started, the CAD or drawing program (e.g., VISIO) is started in step 97, preferably hidden. In step 98 the selected template is started, and in step 99, depending on the data selection, a corresponding template is started in the input form (e.g., the template for the housing design selected in combobox C2). Subsequently, similar or identical program flows are passed through in steps 100 to 105 as in steps 88 to 93. Preferably, a project number is also generated and inserted into the corresponding drawing.

Preferably, in step 100, the shapes with text are filled into a portion of the template. Step 101 checks whether, for instance, "US letter" has been selected and, if YES, a Y starting value of the template is adapted in step 102. Subsequently, in step 103, all objects of the type "shape" in which the property "code" contains either an empty string or the word "none" are set to drawn=true. In step 104, the shapes are then drawn into the template and the open template is closed in step 105.

In step 106, the table "drawings" is opened in the project database or the data memory area (e.g., the database "projects.sag"). In step 107, the data of the objects is entered into the project database. In step 108, preferably the VISIO drawing is entered as long binary data. Subsequently, in step 109, the table "drawings" in the project database, particularly in "projects.sag," is closed. The object collections are emptied in step 110, and the drawing program (e.g., VISIO) is set to visible and displayed in step 111.

FIG. 10 depicts a component database structure for use with a preferred embodiment of the invention. The component database shown in FIG. 10 contains n datasets, which are queried or renewed in the above-described steps and which correspond to the individual components. Each dataset preferably comprises a data field A1, which corresponds to an item number (e.g., Pos 1, Pos 2, Pos 11). The item number is queried to display the corresponding component in the corresponding item of the input form.

Each component dataset further comprises one or more of the following data fields (where i=1 . . . n):

Data field Bi, which corresponds to a modular code of the component (e.g., BA001, BB0H1), Data field Ci, which corresponds to a drawing number of the corresponding component, Data field Di, which corresponds to a drawing version of data field Ci, Data field Ei, which corresponds to a parts description, preferably in different languages, Data field Fi, which corresponds to one or more technical specifications (e.g., volume, flow rate, filtration rates, medium that can be filtered, etc.); this data field can be used to discriminate whether the component should be displayed or offered for selection in an item field P as a function of the selection of the field of application (combobox C1) and/or the housing design (combobox C2), Data field Gi, which corresponds to one or more dimensional and/or structural restrictions (e.g., inside pipe diameter, outside pipe diameter, connection type, volume, throughput etc.); this field, too, can be used to discriminate whether the component in an item field P should be displayed or offered as a selection as a function of the selection of the field of application (combobox C1) and/or the housing design (combobox C2) and/or other selection parameters (e.g., the total volume or the flow rate desired for the filter unit).

Data field Hi, which corresponds to the production costs of the corresponding component, Data field Ii, which corresponds to the selling price, Data field Ji, which corresponds to a technical classification and/or approval of the corresponding component (e.g., for beverages Y/N, for pharmaceutical applications Y/N, for ventilation Y/N, for liquids Y/N, for gas Y/N). The data field Ji can also be used as a table "general fields of application."

When the corresponding component is selected, data fields can preferably be called up, which are evaluated in the display, e.g., to determine the total volume of the filter unit, the calculated filtration rate and/or the total price or production costs of the filter unit.

FIG. 11 shows an allocation database for use with a preferred embodiment of the invention, which makes it possible to allocate components to a product family corresponding to a selectable or selected design (combobox C2). Thus, a "preselection" of the component groups to be displayed (e.g., AA . . . , BA . . . ) is possible by item number and/or product family.

The allocation database depicted in FIG. 11 comprises n datasets which, like the datasets of the component database of FIG. 10, are queried or renewed in the above-described steps and correspond to the individual components. Each dataset of the allocation database preferably comprises a data field Ai, which corresponds to an item number (e.g., Pos 1, Pos 2, Pos 11). The item number is queried to display the corresponding component in the corresponding item of the input form.

Each component dataset further comprises one or more of the following data fields (where i=1 . . . n):

Data field Bi, which corresponds to the modular code family (e.g., AA, BB),

Data field Ci, which corresponds to the product family (e.g., single mini-housing, standard triple housing) and can thus be used in the display of the individual item to discriminate by housing design selection (combobox C2) in the corresponding item fields P. This product family table can also be used as a "general housing design table."

The databases are preferably configured as ACCESS databases but any other database structure, either relational or non-relational, can be used.

FIG. 12 shows an example of a filter unit for liquid media, which is composed of different components or elements from a modular system and can be automatically created by means of a preferred embodiment of the invention.

The filter unit shown in FIG. 12 comprises a top part 1 (corresponding to item 1), which is suitable e.g., for connection to a pressure measuring device. The top part is preferably provided with a lateral valve to ventilate the filter unit. A housing pin 2 may furthermore be provided (corresponding to item 2), which can have different lengths and diameters depending on the design of the filter unit. Preferably, these parameters can be freely selected in the system or method or computer program, or can be selected from among predefined or predefinable selection quantities. The filter unit further comprises at least one cover 3 (corresponding to item 3), with different covers being possible in this respect, and a seal 4 (corresponding to item 4), with different materials and/or shapes being possible for seal 4. This may govern or influence particularly the types of certification and/or the operating conditions of the filter unit (e.g., the operating pressure).

The filter unit is furthermore equipped with a bottom plate 5 (corresponding to item 5), which can have different pipe dimensions, bases, and/or discharge valves. The discharge valves are preferably integrated into the bottom plate only in filter units for liquids.

The filter unit further comprises one or more connections 8 (corresponding to item 8) for inflow and/or outflow, which can consist of different connection types (e.g., clamped connections, flanged connections, etc.). These connections are preferably provided with additionally selectable connections 9 (corresponding to item 9) to connect additional accessories or add-ons.

The filter unit further comprises a filter cartridge or a filtration module 21 (corresponding to item 21). Depending on the design of the filter unit, several filtration modules 21 are also possible.

FIG. 13 shows a further example of a filter unit that can be automatically produced or generated or assembled by means of the invention. The filter unit shown in FIG. 13 is used for gaseous media.

Parts or elements or components of the filter unit depicted in FIG. 12, which are identical or similar to those of the filter unit depicted in FIG. 11, are identified with like reference numerals and correspond to the same item numbers as those of FIG. 11. A detailed description is therefore not provided.

The filter unit shown in FIG. 13 is equipped with a steam trap 6 (corresponding to item 6), which can have different pipe dimensions. Such a steam trap 6 is preferably used only in filter units for gaseous media and thus corresponds to a different item number from that of bottom plate 5 of the filter unit shown in FIG. 12 because bottom plate 5 is preferably used only in filter units for liquid media.

The filter unit depicted in FIG. 13 further comprises a bottom part 7 (corresponding to item 7), which can be used, e.g., to empty the condensate that can collect in steam trap 6.

Although no additional connections 9 for connecting accessories or add-ons are depicted in FIG. 13, such elements may also be provided in the filter unit for gaseous media.

The invention claimed is:

1. A method for automatically generating a drawing of a mechanical filter unit which comprises a plurality of non-moving components or elements, said method comprising the steps of:

selecting at least one of a field of application of the filter unit to be produced from among a plurality of predefined or predefinable fields of application and a design of the filter unit to be produced from among a plurality of predefined or predefinable designs;

generating an input field as a function of the selection made, wherein only those entries are enabled in the input field which correspond to the selection;

checking whether the entries made in each input field are mutually compatible, wherein the compatibility checking step includes automatically generating an error message if the entries made in each input field are not mutually compatible; and based on the results of the mutual compatibility checking step, either outputting the error message if the entries made in each input field are not mutually compatible, or automatically generating a drawing of the mechanical filter unit in accordance with the entries made in each input field if the entries are mutually compatible.

2. A method according to claim 1, wherein the mutual compatibility checking is carried out by retrieving or calling datasets that correspond to the entries and are stored in a database or a data memory area.

3. A method according to claim 1, wherein the generating step includes determining the number of datasets that correspond to the selection made.

4. A method according to claim 1, wherein the generating step comprises generating input fields that are to be sequentially processed, wherein the input fields that are to be sequentially processed correspond at least partially to the respective components of the filter unit to be produced.

5. A method according to claim 4, wherein only components which correspond to the selection made, are offered for selection and can be entered in the corresponding input fields to be sequentially processed.

6. A method according to claim 1, wherein the retrieved datasets are technical characteristics of the components that were selected in the corresponding input fields.

7. A method according to claim 6, wherein said characteristics comprise at least one dimension of the individual components.

8. A method according to claim 1, wherein the design of the filter unit to be produced is selected as a function of at least one parameter selected from the group consisting of the number of filter unit chambers, the desired volume or volume area of a housing of the filter unit, the desired filtration rate of the filter unit, a filtration module used, the inside pipe diameter of individual components, and a ventilation type of the housing.

9. A method according to claim 1, wherein the field of application of the filter unit to be produced is selected as a function of at least one parameter selected from the group consisting of use of the filter unit in a pharmaceutical application, use of the filter unit in a chemical application, use of the filter unit for filtering beverages, use of the filter unit for filtering gases, and use of the filter unit for filtering liquids.

10. A method according to claim 1, furthermore comprising the step of generating a drawing on a display device or a readable medium as a function of the selected or entered components.

11. A computer-based for automatically generating a drawing of a mechanical filter unit which filter comprises a plurality of non-movable components or elements, comprising a computer programmed to execute a method for automatically producing a filter unit which filter comprises a plurality of components or elements, said method comprising the steps of:

selecting at least one of a field of application of the filter unit to be produced from among a plurality of predefined or predefinable fields of application and a design of the filter unit to be produced from among a plurality of predefined or predefinable designs;

generating an input field as a function of the selection made, wherein only those entries are enabled in the input field which correspond to the selection;

checking whether the entries made in each input field are mutually compatible, wherein the compatibility checking step includes automatically generating an error message if the entries made in each input field are not mutually compatible; and based on the results of the mutual compatibility checking step, either outputting the error message if the entries made in each input field are not mutually compatible, or generating at least one command for automatically generating a drawing of the mechanical filter unit in accordance with the entries made in each input field if the entries are mutually compatible.

12. A computer system for automatically automatically generating a drawing of a mechanical filter unit comprising a plurality of non-movable components or elements, said computer system comprising a memory unit, an evaluation unit, an input unit and an output unit, wherein the input unit comprises means for selecting at least one of a field of application of the filter unit to be produced from among a plurality of predefined or predefinable fields of application and a design of the filter unit to be produced from among a plurality of predefined or predefinable designs; wherein the evaluation unit comprises means for generating an input field on the display device as a function of the selection made, wherein only those inputs which correspond to the selection made are enabled in the input field, wherein the evaluation unit further comprises means for checking whether the entries made in each input field are mutually compatible, and wherein the evaluation unit further comprises means for automatically generating an error message if the entries made in each input field are not mutually compatible, and based on the results of the mutual compatibility checking step, either outputting the error message if the entries made in each input field are not mutually compatible, or generating at least one command for automatically generating a drawing of the mechanical filter unit in accordance with the entries made in each input field if the entries are mutually compatible.

13. A computer system according to claim 12, wherein the mutual compatibility checking means retrieves or calls up datasets that correspond to the entries to be checked and that are stored in a database or a data memory area.

* * * * *